United States Patent
Olsson et al.

(10) Patent No.: US 9,144,180 B2
(45) Date of Patent: Sep. 22, 2015

(54) THERMOELECTRIC HEAT PUMP WITH A SURROUND AND SPACER (SAS) STRUCTURE

(71) Applicant: Phononic Devices, Inc., Durham, NC (US)

(72) Inventors: Mattias K-O Olsson, Durham, NC (US); Abhishek Yadav, Raleigh, NC (US); Devon Newman, Morrisville, NC (US)

(73) Assignee: Phononic Devices, Inc., Durham, NC (US)

( * ) Notice: Subject to any disclaimer, the term of this patent is extended or adjusted under 35 U.S.C. 154(b) by 0 days.

(21) Appl. No.: 14/525,843

(22) Filed: Oct. 28, 2014

(65) Prior Publication Data
US 2015/0116943 A1    Apr. 30, 2015

Related U.S. Application Data

(60) Provisional application No. 61/896,287, filed on Oct. 28, 2013.

(51) Int. Cl.
*H05K 7/20* (2006.01)
*H01L 35/32* (2006.01)

(52) U.S. Cl.
CPC ............ *H05K 7/20418* (2013.01); *H01L 35/32* (2013.01); *H05K 7/20509* (2013.01)

(58) Field of Classification Search
USPC ................. 361/633, 676–678, 679.33–679.4, 361/679.46–679.49, 679.54, 688–690, 361/704–722, 752–760, 831
See application file for complete search history.

(56) References Cited

U.S. PATENT DOCUMENTS

| | | |
|---|---|---|
| 2,497,150 A | 2/1950 | Carlson et al. |
| 3,191,391 A | 6/1965 | Muller |
| 3,196,620 A | 7/1965 | Elfving et al. |

(Continued)

FOREIGN PATENT DOCUMENTS

| | | |
|---|---|---|
| EP | 2503611 A2 | 9/2012 |
| WO | 2004054007 A2 | 6/2004 |

(Continued)

OTHER PUBLICATIONS

International Search Report and Written Opinion for PCT/US2014/062685 mailed Jan. 16, 2015, 11 pages.

(Continued)

*Primary Examiner* — Courtney Smith
(74) *Attorney, Agent, or Firm* — Withrow & Terranova, PLLC

(57) ABSTRACT

A heat pump includes a SAS structure with a wall defining a first open side and a second open side. The heat pump also includes an interconnect board, enclosed within the SAS structure including openings. Thermoelectric modules are mounted on the interconnect board at the locations defined by the openings. The heat pump additionally includes a hot-side heat spreader that is in thermal contact with the first side of each thermoelectric module and a cold-side heat spreader that is in thermal contact with the second side of each thermoelectric module. The periphery of the hot-side heat spreader mechanically contacts the wall of the SAS structure at the first open side, and the periphery of the cold-side heat spreader mechanically contacts the wall of the SAS structure at the second open side such that any compression force applied to the heat pump is absorbed by the SAS structure.

20 Claims, 7 Drawing Sheets

(56) References Cited

U.S. PATENT DOCUMENTS

Figure 1:
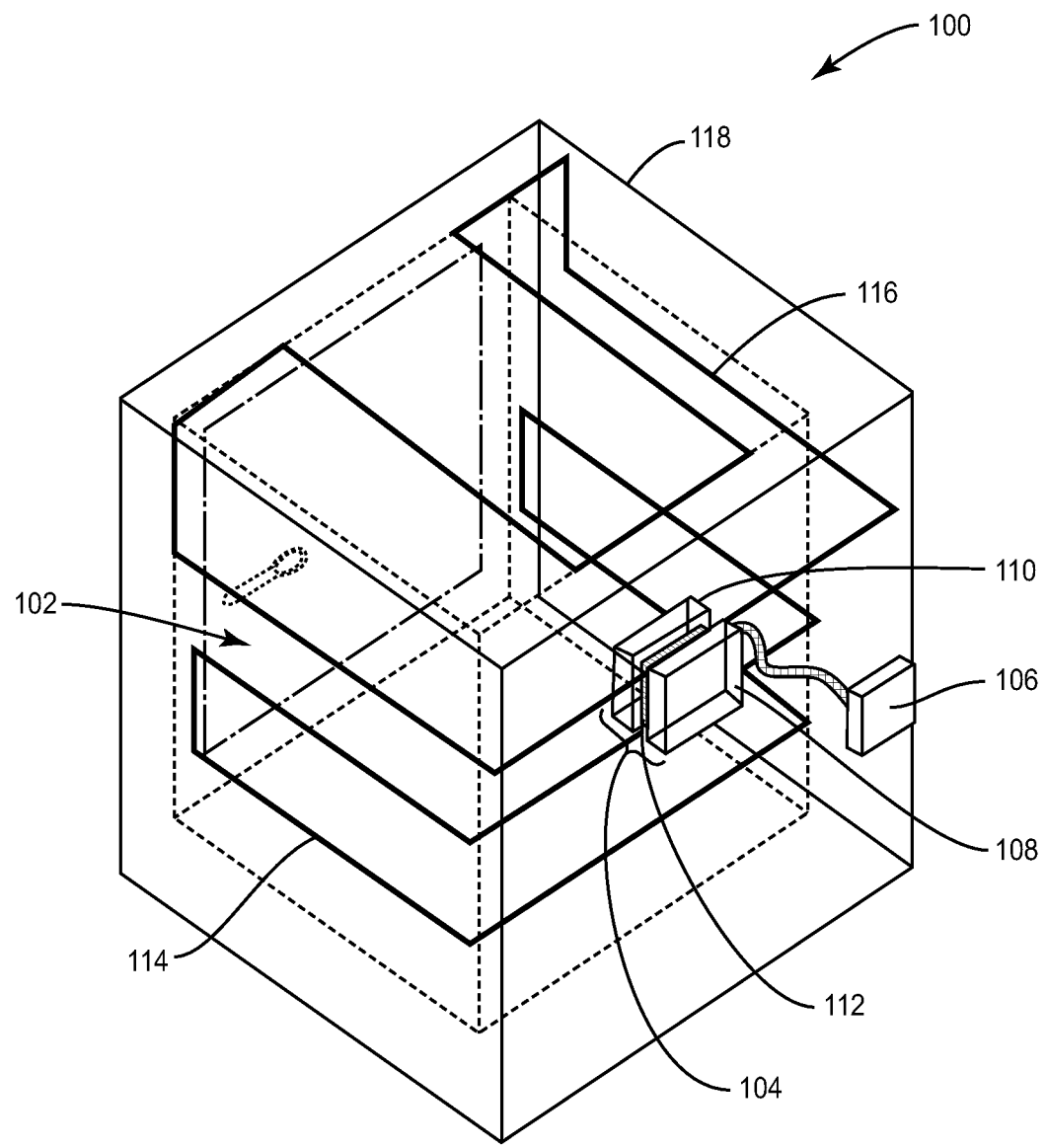

| | | | |
|---|---|---|---|
| 6,314,741 B1 | 11/2001 | Hiraishi | |
| 6,345,507 B1 | 2/2002 | Gillen | |
| 6,418,729 B1 | 7/2002 | Dominguez-Alonso et al. | |
| 6,463,743 B1 | 10/2002 | Laliberté | |
| 8,893,513 B2* | 11/2014 | June et al. | 62/3.7 |
| 2002/0038550 A1* | 4/2002 | Gillen | 62/3.7 |
| 2003/0111516 A1 | 6/2003 | Ghoshal | |
| 2004/0068991 A1* | 4/2004 | Banney et al. | 62/3.7 |
| 2004/0154312 A1 | 8/2004 | Abras | |
| 2005/0091989 A1 | 5/2005 | Leija et al. | |
| 2005/0126184 A1 | 6/2005 | Cauchy | |
| 2006/0232891 A1* | 10/2006 | Bushnik et al. | 360/265.6 |
| 2008/0022696 A1 | 1/2008 | Welle et al. | |
| 2008/0098750 A1 | 5/2008 | Busier | |
| 2008/0236175 A1 | 10/2008 | Monferrer et al. | |
| 2009/0000310 A1 | 1/2009 | Bell et al. | |
| 2012/0201008 A1 | 8/2012 | Hershberger et al. | |
| 2013/0227966 A1* | 9/2013 | Ayres et al. | 62/3.2 |
| 2013/0291560 A1 | 11/2013 | Therrien et al. | |
| 2014/0117528 A1* | 5/2014 | Byun et al. | 257/713 |
| 2014/0150839 A1* | 6/2014 | Hershberger et al. | 136/205 |

FOREIGN PATENT DOCUMENTS

| | | |
|---|---|---|
| WO | 2011127416 A2 | 10/2011 |
| WO | 2012131007 A2 | 10/2012 |

OTHER PUBLICATIONS

Non-Final Office Action for U.S. Appl. No. 13/867,567, mailed Oct. 2, 2013, 9 pages.

Final Office Action for U.S. Appl. No. 13/867,567, mailed May 1, 2014, 11 pages.

Advisory Action and Examiner-Initiated Interview Summary for U.S. Appl. No. 13/867,567, mailed Sep. 11, 2014, 5 pages.

Non-Final Office Action for U.S. Appl. No. 13/867,567, mailed Oct. 9, 2014, 13 pages.

* cited by examiner

THERMOELECTRIC HEAT PUMP WITH A SURROUND AND SPACER (SAS) STRUCTURE

RELATED APPLICATIONS

This application claims the benefit of provisional patent application Ser. No. 61/896,287, filed Oct. 28, 2013, the disclosure of which is hereby incorporated herein by reference in its entirety.

FIELD OF THE DISCLOSURE

The present disclosure relates to a thermoelectric heat pump with a surround and spacer (SAS) structure.

BACKGROUND

Thermoelectric modules (TEMs) are often fabricated from fragile materials. As used herein, a thermoelectric module is an integrated circuit including multiple thermoelectric devices. As an example, the interested reader is directed to U.S. Pat. No. 8,216,871, entitled METHOD FOR THIN FILM THERMOELECTRIC MODULE FABRICATION, which is hereby incorporated herein by reference in its entirety. These TEMs may fail if stresses or forces are applied to the TEMs. Also, many TEMs suffer diminished performance when exposed to moisture or other environmental contaminants. As such, these TEMs are potted to provide protection from environmental contaminants. Potting is a process of adding material to an electronic assembly such as a solid or gelatinous compound. Potting is often done to provide some resistance to shock and vibration, and for exclusion of moisture and corrosive agents. Heat-cured plastics or silicone is often used. But when applied to the surface of TEMs, the potting material creates a thermal short between the hot sides and cold sides of the TEMs. This thermal short is one type of thermal parasitic that decreases the efficiency of the heat pump.

Accordingly, what is needed is a heat pump where the TEMs are protected. Furthermore, what is needed is a heat pump that reduces thermal parasitics.

SUMMARY

The present disclosure relates to a thermoelectric heat pump with a surround and spacer (SAS) structure. In one embodiment, a heat pump includes a SAS structure. The SAS structure includes a wall defining a first open side and a second open side. The heat pump also includes an interconnect board enclosed within the SAS structure. The interconnect board includes openings from a first surface of the interconnect board to a second surface of the interconnect board where the openings define locations at which thermoelectric modules (TEMs) are to be mounted on the interconnect board. TEMs are mounted on the interconnect board at the locations defined by the openings. Each thermoelectric module has a first side and a second side. The heat pump additionally includes a hot-side heat spreader that is in thermal contact with the first side of each thermoelectric module and a cold-side heat spreader that is in thermal contact with the second side of each thermoelectric module. The periphery of the hot-side heat spreader mechanically contacts the wall of the SAS structure at the first open side, and the periphery of the cold-side heat spreader mechanically contacts the wall of the SAS structure at the second open side. A compression force applied to the heat pump is absorbed by the SAS structure and, as such, the TEMs are protected from the compression force.

In one embodiment, the heat pump also includes an environmental seal located where the periphery of the hot-side heat spreader mechanically contacts the wall of the SAS structure and where the periphery of the cold-side heat spreader mechanically contacts the wall of the SAS structure.

In one embodiment, a thickness of the wall of the SAS structure is such that a thermal short between the hot-side heat spreader and the cold-side heat spreader is mitigated while providing sufficient strength to withstand at least a predefined amount of a compression force applied to the heat pump. In one embodiment, a height of the SAS structure defines a distance between the hot-side heat spreader and the cold-side heat spreader where the distance is such that a thermal short between the hot-side heat spreader and the cold-side heat spreader is mitigated.

In one embodiment, the combined area of the second sides of the TEMs is greater than fifty percent of the area of the interconnect board. In another embodiment, the combined area of the second sides of the TEMs is greater than seventy-five percent of the area of the interconnect board.

In one embodiment, the heat pump also includes insulation between the hot-side heat spreader and the cold-side heat spreader and enclosed in the SAS structure. In one embodiment, the insulation is preformed. In another embodiment, the insulation is injected.

In one embodiment, the hot-side heat spreader and the cold-side heat spreader are each attached to the SAS structure by a mechanical fastener. In one embodiment, the mechanical fastener is selected from the group consisting of a screw, a bolt, and a rivet. In another embodiment, the hot-side heat spreader and the cold-side heat spreader are each attached to the SAS structure by a chemical fastener. In one embodiment, the chemical fastener is selected from the group consisting of a glue, an epoxy, and an acrylic adhesive.

In one embodiment, at least one of the hot-side heat spreader and the cold-side heat spreader is attached to the SAS structure by a snap fastener, or snap feature. In one embodiment, the snap fastener includes a lip around a periphery of the SAS structure that allows the at least one of the hot-side heat spreader and the cold side heat spreader to be attached to the SAS structure by tension.

In one embodiment, the hot-side heat spreader is attached to the SAS structure by a snap fastener, or snap feature. In one embodiment, the snap feature includes a lip around a periphery of the first open side of the SAS structure that allows the hot-side heat spreader to be attached to the SAS structure by tension. In one embodiment, the second open side of the SAS structure is smaller than the cold-side heat spreader, and the cold-side heat spreader is within the SAS structure at the second open side of the SAS structure. In one embodiment, the SAS structure is tapered such that the second open side of the SAS structure is smaller than the first open side of the SAS structure.

In one embodiment, the heat pump also includes one or more wires electrically attached to the interconnect board and exposed through the SAS structure. In one embodiment, the heat pump also includes a cap to protect the one or more wires exposed through the SAS structure. In another embodiment, the interconnect board also includes one or more electrical connectors exposed through the SAS structure.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2B:
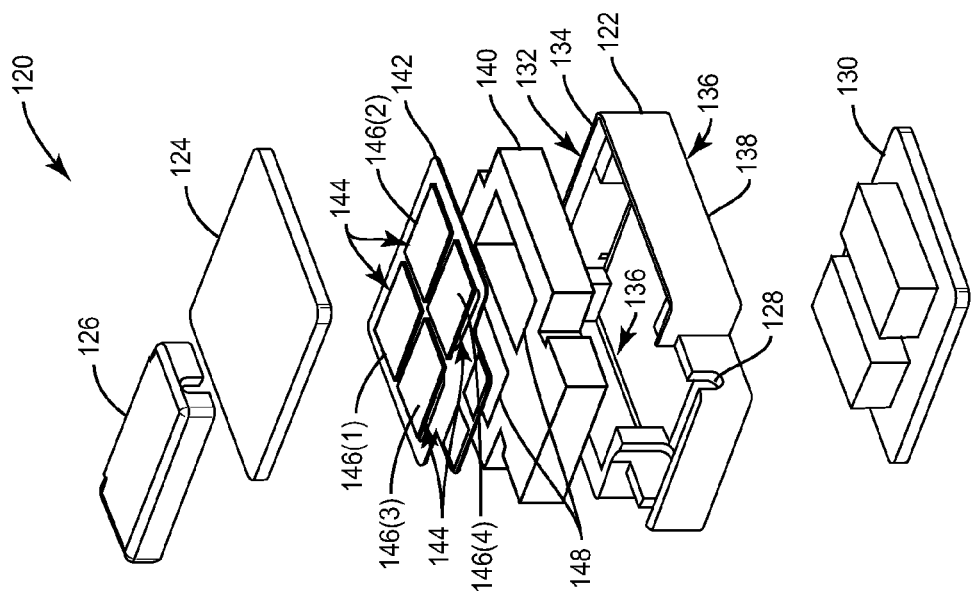
Figure 2A:
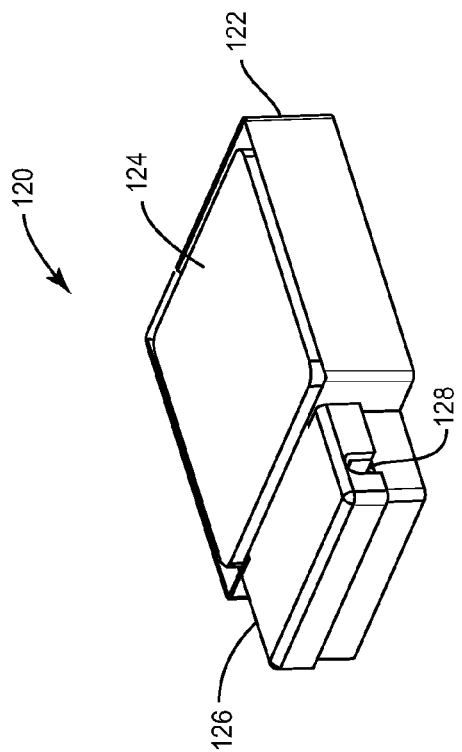
Figure 2C:
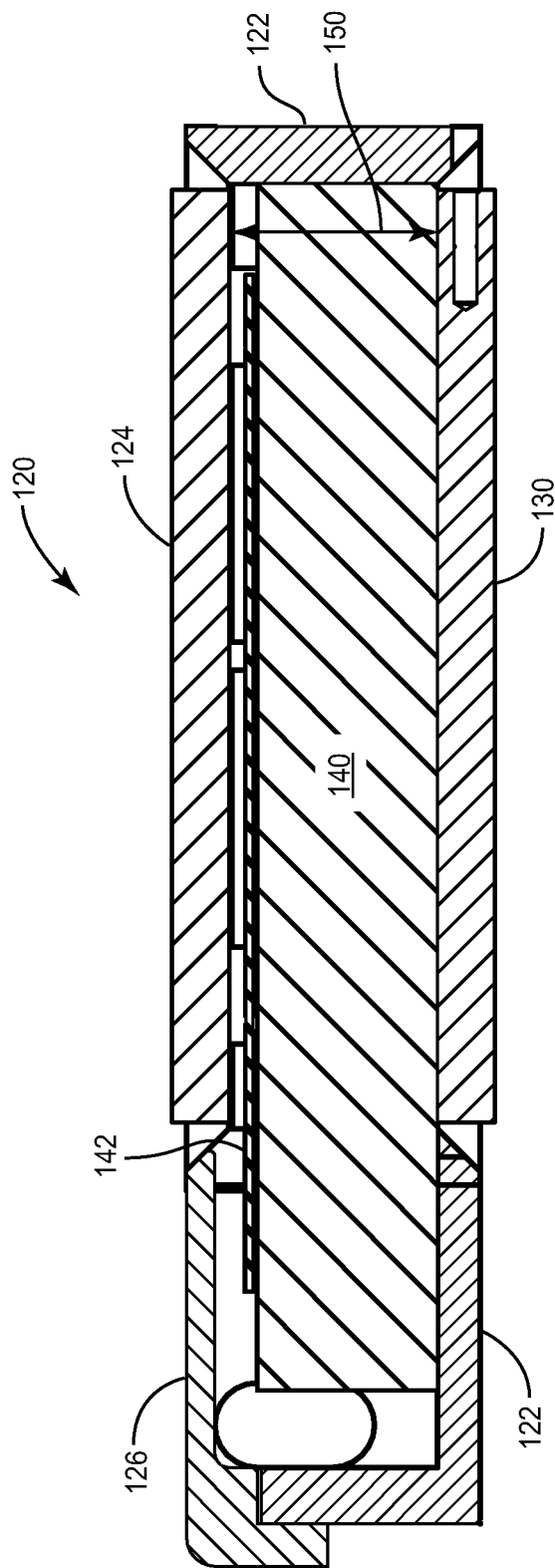
Figures 3A, 3B:
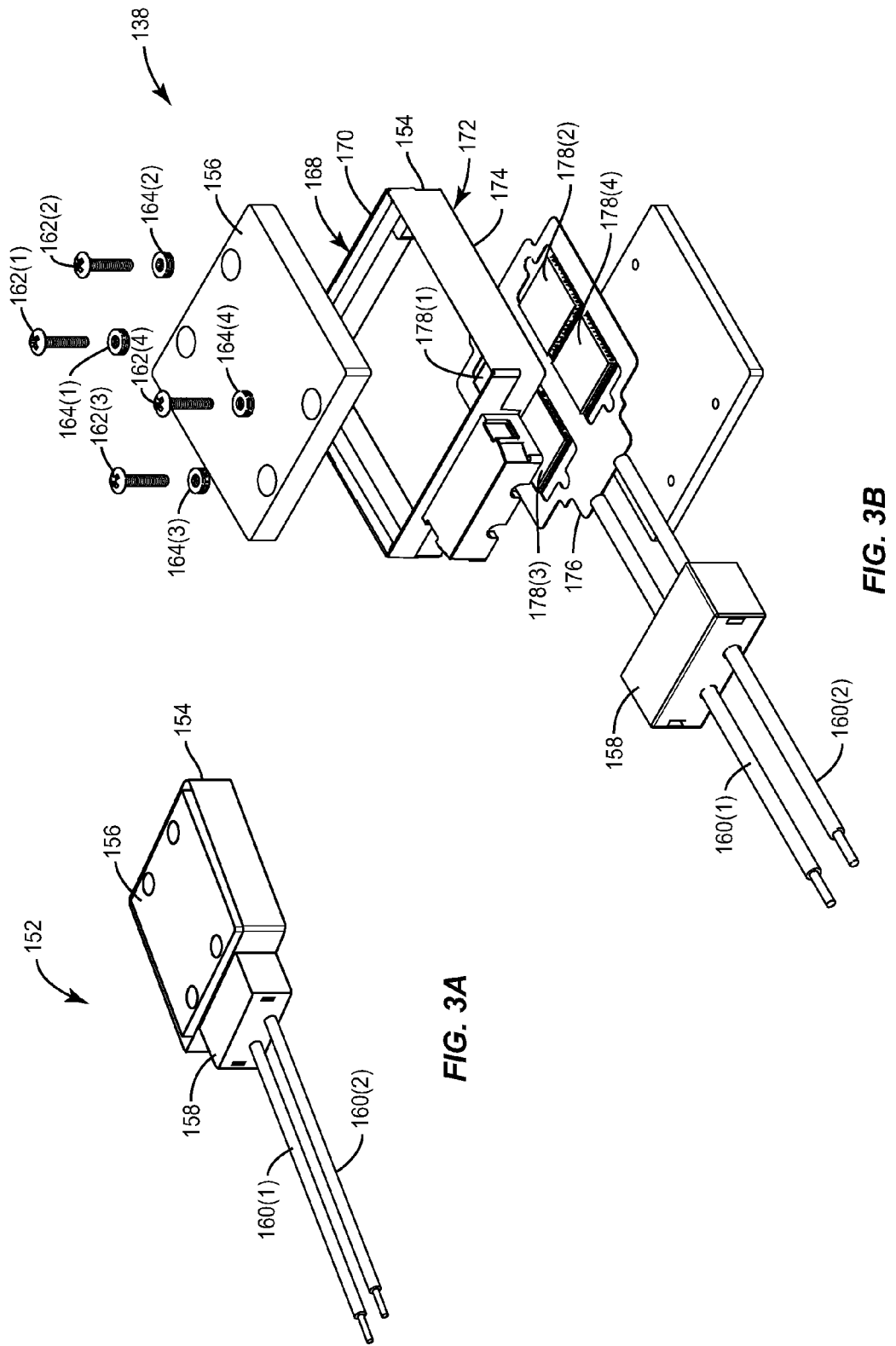
Figure 3C:
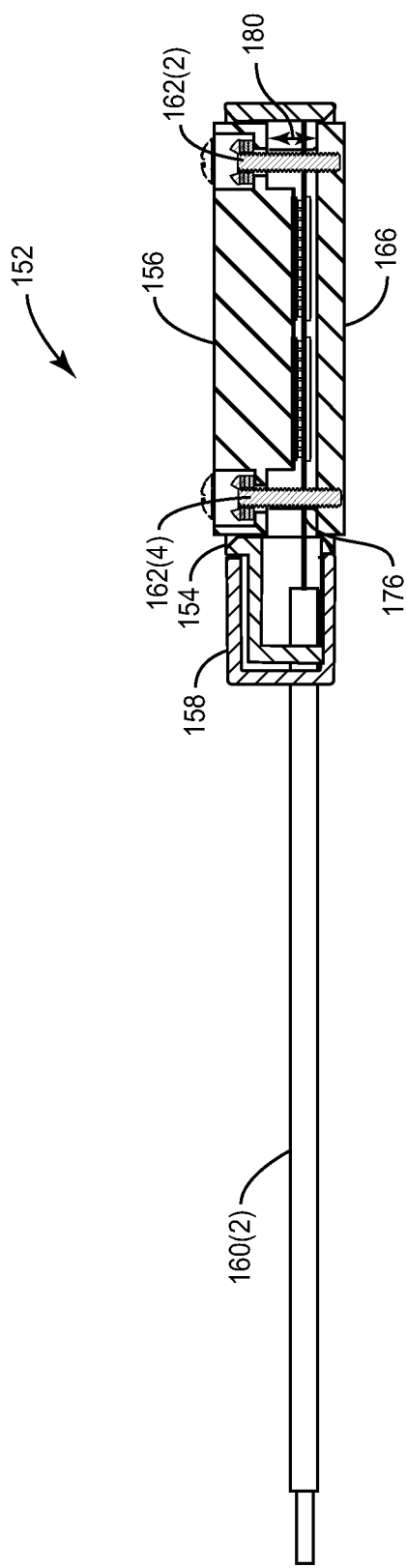
Figure 4B:
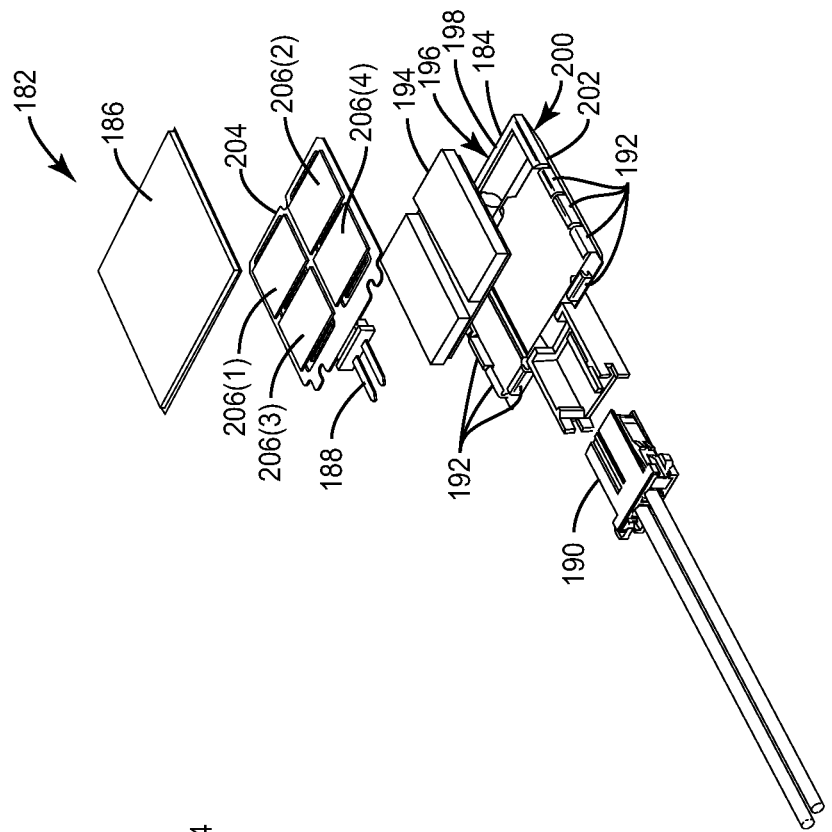
Figure 4A:
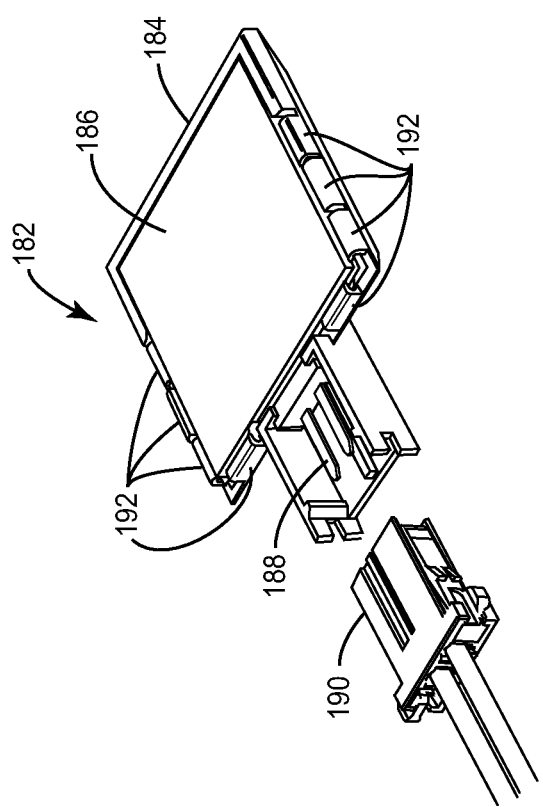
Figure 4C:
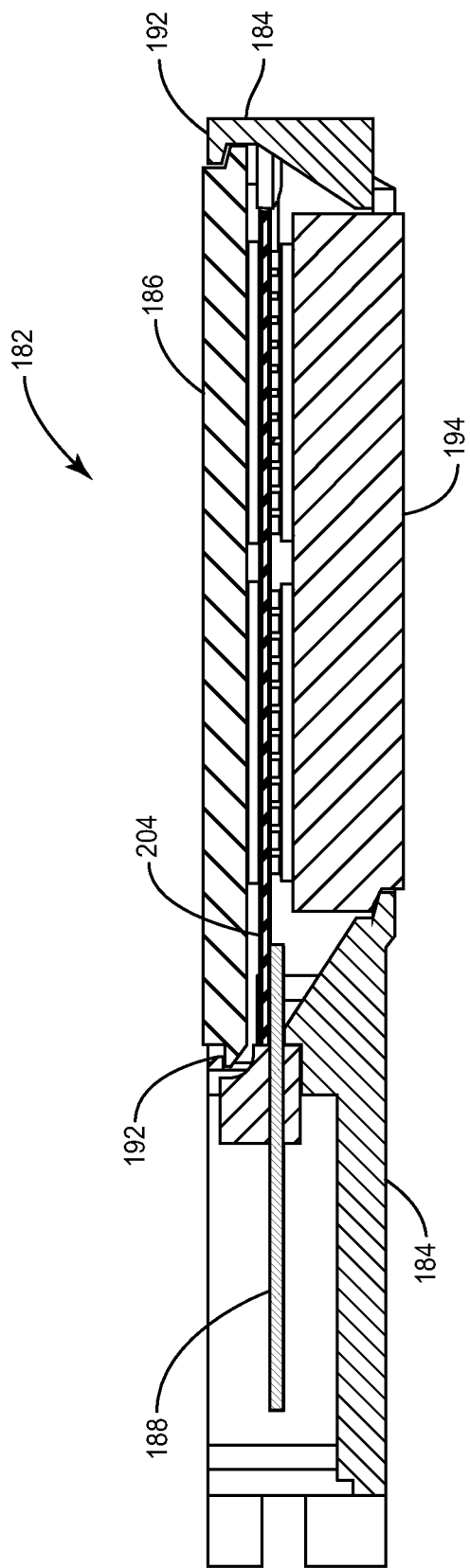

FIG. 1 illustrates a thermoelectric refrigeration system having a cooling chamber and a heat pump including multiple Thermoelectric Modules (TEMs) disposed between a cold-side heat spreader and a hot-side heat spreader, according to one embodiment of the present disclosure;

FIGS. 2A-C illustrate a heat pump with preformed insulation, according to one embodiment of the present disclosure;

FIGS. 3A-C illustrate a heat pump using mechanical fasteners, according to another embodiment of the present disclosure;

FIGS. 4A-C illustrate a heat pump where the hot-side heat spreader is held in place by tension, according to another embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a thermoelectric heat pump with a surround and spacer (SAS) structure. While the thermoelectric heat pump may be utilized in any suitable type of system, in some embodiments, the thermoelectric heat pump is utilized in a thermoelectric refrigeration system. However, the concepts disclosed herein are not limited thereto. In this regard, FIG. 1 illustrates an example thermoelectric refrigeration system 100 according to one embodiment of the present disclosure. As illustrated, the thermoelectric refrigeration system 100 includes a cooling chamber 102, a heat exchanger 104, and a controller 106 that controls cooling within the cooling chamber 102. The heat exchanger 104 includes a hot side heat sink 108, a cold side heat sink 110, and a heat pump 112 including multiple Thermoelectric Modules (TEMs), where each TEM has a cold side that is thermally coupled with the cold side heat sink 110 and a hot side that is thermally coupled with the hot side heat sink 108. As used herein, a TEM is an integrated circuit including multiple thermoelectric devices. In some implementations, the thermoelectric devices can be thin-film devices. When one or more of the TEMs are activated by the controller 106, the activated TEM(s) operates to heat the hot side heat sink 108 and cool the cold side heat sink 110 to thereby facilitate heat transfer to extract heat from the cooling chamber 102. More specifically, when one or more of the TEMs are activated, the hot side heat sink 108 is heated to thereby create an evaporator and the cold side heat sink 110 is cooled to thereby create a condenser.

Acting as a condenser, the cold side heat sink 110 facilitates heat extraction from the cooling chamber 102 via an accept loop 114 coupled with the cold side heat sink 110. The accept loop 114 is formed by any type of plumbing that allows for a cooling medium (e.g., a two-phase coolant) to flow or pass through the accept loop 114. The cooling medium extracts heat from the cooling chamber 102 as the cooling medium flows through the accept loop 114. The accept loop 114 may be formed of, for example, copper tubing, plastic tubing, stainless steel tubing, aluminum tubing, or the like.

The condenser formed by the cold side heat sink 110 and the accept loop 114 operates according to any suitable heat exchange technique. In one preferred embodiment, the accept loop 114 operates in accordance with thermosiphon principles (i.e., acts as a thermosiphon) such that the cooling medium travels from the cold side heat sink 110 through the accept loop 114 and back to the cold side heat sink 110 to thereby cool the cooling chamber 102 using two-phase, passive heat transport. In particular, passive heat exchange occurs through natural convection between the cooling medium in the accept loop 114 and the cooling chamber 102. In one embodiment, the cooling medium is in liquid form when the cooling medium comes into thermal contact with the cooling chamber 102. Specifically, passive heat exchange occurs between the environment in the cooling chamber 102 and the cooling medium within the accept loop 114 such that the temperature in the cooling chamber 102 decreases, and the temperature of the cooling medium increases and/or undergoes a phase change. When the temperature of the cooling medium increases, the density of the cooling medium decreases, such as through evaporation. As a result, the cooling medium moves in an upward direction via buoyancy forces in the accept loop 114 towards the heat exchanger 104 and specifically towards the cold side heat sink 110. The cooling medium comes into thermal contact with the cold side heat sink 110 where heat exchange occurs between the cooling medium and the cold side heat sink 110. When heat exchange occurs between the cooling medium and the cold side heat sink 110, the cooling medium condenses and again flows through the accept loop 114 via gravity in order to extract additional heat from the cooling chamber 102. Thus, in some embodiments, the accept loop 114 functions as an evaporator when cooling the cooling chamber 102.

As noted above, the heat exchanger 104 includes the heat pump 112 disposed between the hot side heat sink 108 and the cold side heat sink 110. The TEMs in the heat pump 112 have hot sides (i.e., sides that are hot during operation of the TEMs) that are thermally coupled with the hot side heat sink 108 and cold sides (i.e., sides that are cold during operation of the TECs) that are thermally coupled with the cold side heat sink 110. The TEMs within the heat pump 112 effectively facilitate heat transfer between the cold side heat sink 110 and the hot side heat sink 108. More specifically, when heat transfer occurs between the cooling medium in the accept loop 114 and the cold side heat sink 110, the active TEMs transfer heat between the cold side heat sink 110 and the hot side heat sink 108.

Acting as an evaporator, the hot side heat sink 108 facilitates rejection of heat to an environment external to the cooling chamber 102 via a reject loop 116 coupled to the hot side heat sink 108. The reject loop 116 is thermally coupled to an outer wall 118, or outer skin, of the thermoelectric refrigeration system 100. The outer wall 118 is in direct thermal contact with the environment external to the cooling chamber 102. In one embodiment, the reject loop 116 is integrated into the outer wall 118 or integrated onto the surface of the outer wall 118. The reject loop 116 is formed of any type of plumbing that allows a heat transfer medium (e.g., a two-phase coolant) to flow or pass through the reject loop 116. Due to the thermal coupling of the reject loop 116 and the external environment, the heat transfer medium rejects heat to the external environment as the heat transfer medium flows through the reject loop 116. The reject loop 116 may be formed of, for example, copper tubing, plastic tubing, stainless steel tubing, aluminum tubing, or the like.

The evaporator formed by the hot side heat sink 108 and the reject loop 116 operates according to any suitable heat exchange technique. In one preferred embodiment, the reject loop 116 operates in accordance with thermosiphon principles (i.e., acts as a thermosiphon) such that the heat transfer medium travels from the hot side heat sink 108 through the reject loop 116 and back to the hot side heat sink 108 to thereby reject heat using two-phase, passive heat transport. In particular, the hot side heat sink 108 transfers the heat received from the cold side heat sink 110 to the heat transfer medium within the reject loop 116. Once heat is transferred to the heat transfer medium, the heat transfer medium changes phase and travels through the reject loop 116 and comes into thermal contact with the outer wall 118 such that heat is expelled to the environment external to the cooling chamber 102. When the heat transfer medium within the reject loop 116 is in direct thermal contact with the outer wall 118, passive heat exchange occurs between the heat transfer medium in the reject loop 116 and the external environment. As is well known, the passive heat exchange causes condensation of the heat transfer medium within the reject loop 116, such that the heat transfer medium travels back to the heat exchanger 104 by force of gravity. Thus, the reject loop 116 functions as a condenser when rejecting heat to the environment external to the cooling chamber 102.

The efficiency of the thermoelectric refrigeration system 100 is increased if the thermal resistance between the heat pump 112 and the hot side heat sink 108 and the cold side heat sink 110 is reduced. One way to reduce this thermal resistance is to provide a tight connection between the heat pump 112 and the hot side heat sink 108 and the cold side heat sink 110. Because the TEMs are often fabricated from fragile materials, if left unprotected, the TEMs included in heat pump 112 may fail if stresses or forces are applied to the TEMs. Also, if left without an environmental barrier, the TEMs may suffer diminished performance when exposed to moisture or other environmental contaminants. The conventional technique for protecting TEMs from environmental contaminants is potting. Potting is a process of adding material to an electronic assembly such as a solid or gelatinous compound. Potting is often done to provide some resistance to shock and vibration, and for exclusion of moisture and corrosive agents. Heat-cured plastics or silicone is often used. But when applied to the surface of TEMs, the potting material creates a thermal short between the hot sides and cold sides of the TEMs. This thermal short is one type of thermal parasitic that would decrease the efficiency of the heat pump 112. As used herein, a thermal parasitic is anything that decreases the efficiency of a heat pump, especially something that decreases the temperature difference between the hot side and the cold side of a heat pump.

As discussed below, the heat pump 112 is designed to both protect the TEMs from mechanical forces, particularly compression forces, as well as to protect the TEMs from environmental contaminants. In addition, the heat pump 112 is designed to minimize or at least reduce thermal shorts between the hot and cold sides.

In this regard, FIG. 2A shows a thermoelectric heat pump 120 with a surround and spacer (SAS) structure 122, according to one embodiment. This thermoelectric heat pump 120 may, in some embodiments, be utilized in the thermoelectric refrigeration system 100 as the thermoelectric heat pump 112. FIG. 2A also shows a hot-side heat spreader 124 that forms a top surface of the thermoelectric heat pump 120 and an optional cap 126 to protect one or more wires (not shown) exposed through opening 128 between the cap 126 and the SAS structure 122.

FIG. 2B shows an exploded view of the same thermoelectric heat pump 120. As illustrated, the thermoelectric heat pump 120 includes a cold-side heat spreader 130 that forms a bottom surface of the thermoelectric heat pump 120. The hot-side heat spreader 124 fits into a first open side 132 of the SAS structure 122 such that a periphery of the hot-side heat spreader 124 mechanically contacts a top surface 134 (i.e., the top of the wall) of the SAS structure 122. The cold-side heat spreader 130 fits into a second open side 136 of the SAS structure 122 such that a periphery of the cold-side heat spreader 130 mechanically contacts a bottom surface 138 (i.e., the bottom of the wall) of the SAS structure 122. A preformed insulation 140 is between the hot-side heat spreader 124 and the cold-side heat spreader 130 and is enclosed within the SAS structure 122. Specifically, in this example, the preformed insulation 140 is between the cold-side heat spreader 130 and an interconnect board 142. The interconnect board 142 is enclosed within the SAS structure 122. The interconnect board 142 includes one or more openings 144 through the interconnect board 142 (i.e., from a first surface of the interconnect board 142 to a second surface of the interconnect board 142). The one or more openings 144 define locations at which TEMs 146(1) through 146(4) (hereinafter referred to as TEM 146 or TEMs 146) are to be and therefore are mounted on the interconnect board 142.

A periphery of the hot-side heat spreader 124 mechanically contacts a top surface 134 (i.e., the top of the wall) of the SAS structure 122 at the first open side 132 of the SAS structure 122. Similarly, as discussed above, the periphery of the cold-side heat spreader 130 mechanically contacts the bottom surface 138 of the SAS structure 122 at the second open side 136 of the SAS structure 122. As such, any compression force applied to the thermoelectric heat pump 120 is absorbed by the SAS structure 122. According to some embodiments, this can protect the interconnect board 142 and the TEMs 146 included inside the SAS structure 122 while also allowing significant force to be applied to the thermoelectric heat pump 120. These compression forces may be desirable when mounting the heat pump 120. For example, in the thermoelectric refrigeration system 100 of FIG. 1, compression forces may be desired to improve the thermal contact between the heat pump 112 and the hot and cold side heat sinks 108 and 110. In this embodiment, a chemical fastener such as a glue, an epoxy, or an acrylic adhesive is used to attach the hot-side heat spreader 124 and the cold-side heat spreader 130 to the SAS structure 122. This is merely one possible way of attaching the elements, and others will be disclosed below in relation to other embodiments.

Also, an environmental barrier can be formed where the hot-side heat spreader 124 and the cold-side heat spreader 130 mechanically contact the SAS structure 122. This environmental barrier could be created with a gasket, welding, or any other appropriate sealant. Creating the environmental barrier at the SAS structure 122 instead of on the TEMs 146 directly reduces a thermal short between the hot-side heat spreader 124 and the cold-side heat spreader 130. If the environmental barrier were created closer to or on the TEMs 146, as is typically done by potting the TEMs 146 with a silicone, epoxy, or any other suitable material, heat could flow between the hot-side heat spreader 124 and the cold-side heat spreader 130 through the material used to create the environmental barrier. Moving the environmental barrier further away from the TEMs 146 reduces the thermal short between the hot-side heat spreader 124 and the cold-side heat spreader 130, thus reducing a thermal parasitic of the heat pump 120. Also, the thickness of the wall of the SAS structure 122 directly affects the amount of heat that can flow between the hot-side heat spreader 124 and the cold-side heat spreader 130. By reducing the thickness of the wall of the SAS structure 122, less material exists to transport heat between the hot-side heat spreader 124 and the cold-side heat spreader 130. Thus, the thickness of the wall of the SAS structure 122 may be optimized to provide a desired amount of structural strength (e.g., to protect against at least a predefined amount of compression forces) while also reducing the transport of heat between the hot-side heat spreader 124 and the cold-side heat spreader 130.

The preformed insulation 140 provides a thermal resistance between the hot-side heat spreader 124 and the cold-side heat spreader 130. In operation, the temperature difference between the hot-side heat spreader 124 and the cold-side heat spreader 130 will be large. Without some type of insulation, such as the preformed insulation 140, some of the heat from the hot-side heat spreader 124 would dissipate to the cold-side heat spreader 130 via convection, for example. This again reduces a thermal parasitic of the thermoelectric heat pump 120 by reducing the flow of heat between the hot-side heat spreader 124 and the cold-side heat spreader 130. As is shown in FIG. 2B, the preformed insulation 140 includes one or more openings 148 to allow the cold-side heat spreader 130 to extend through the preformed insulation 140 and thermally contact the TEMs 146. While this configuration is shown in FIG. 2, this disclosure is not limited thereto.

The combined area of the TEMs 146 is considered an "active" area of the heat pump 120 because it actively heats or cools, depending on the side of the TEMs 146. The remainder of the interconnect board 142 is considered to be an "inactive" area of the heat pump 120 because it does not actively heat or cool. The more inactive area in a heat pump 120, the more heat that will be lost to this inactive area, making the heat pump 120 less efficient. In order to minimize this thermal parasitic of heat pump 120, the amount of inactive area of the heat pump 120 is reduced. In one embodiment, the combined area of the TEMs 146 is greater than fifty percent of the area of the interconnect board 142. That is, there is more active area than inactive area, thus reducing a thermal parasitic of the heat pump 120. In another embodiment, the combined area of the TEMs 146 is greater than seventy-five percent of the area of the interconnect board 142. That is, active area is more than three times the inactive area, thus reducing a thermal parasitic of the heat pump 120.

In order to provide power to the TEMs 146, this embodiment allows wires (not shown) to be connected to the interconnect board 142. The cap 126 provides a strain relief for the wires used to connect the TEMs 146 to a power source. In this embodiment, the cap 126 is also part of the environmental seal.

FIG. 2C shows a side-profile cutaway view of the heat pump 120. In this view, the SAS structure 122 is shown as two pieces due to the cutaway. The preformed insulation 140 is shown separating the hot-side heat spreader 124 and the cold-side heat spreader 130. While gaps may be shown in these figures, these do not always imply a physical gap between components. The SAS structure 122 also provides a defined distance 150 between the hot-side heat spreader 124 and the cold-side heat spreader 130. This defined distance 150 can be adjusted by adjusting both the height of the SAS structure 122 and how the hot-side heat spreader 124 and the cold-side heat spreader 130 mechanically connect to the SAS structure 122. The defined distance 150 between the hot-side heat spreader 124 and the cold-side heat spreader 130 may be optimized to reduce a thermal resistance of one or both of the hot-side heat spreader 124 and the cold-side heat spreader 130 while also reducing the transport of heat between the hot-side heat spreader 124 and the cold-side heat spreader 130. As an example, if the defined distance 150 is reduced, the thermal short between the hot-side heat spreader 124 and the cold-side heat spreader 130 is increased because the heat can more easily travel between them by, for example, convection. On the other hand, if the defined distance 150 is increased, the size of one or both of the hot-side heat spreader 124 and the cold-side heat spreader 130 must be increased to maintain thermal contact with the TEMs 146. This increase in size increases the thermal resistance of the hot-side heat spreader 124 or the cold-side heat spreader 130, reducing the efficiency of the heat pump 120.

FIGS. 3A-C illustrate a heat pump 152 according to another embodiment of the present disclosure. This thermoelectric heat pump 152 may, in some embodiments, may be utilized in the thermoelectric refrigeration system 100 as the thermoelectric heat pump 112. Heat pump 152 shares many features in common with heat pump 120 illustrated in FIGS. 2A-C. As such, some repetition is avoided, while particular emphasis is placed on the features of heat pump 152 that are different from the heat pump 120. In this regard, FIG. 3A illustrates heat pump 152 with a SAS structure 154. Heat pump 152 also includes a hot-side heat spreader 156 and a cap 158. Unlike heat pump 120, FIG. 3A shows that heat pump 152 is held together by a mechanical fastener. In one embodiment, the mechanical fastener is selected from the group consisting of a screw, a bolt, and a rivet. FIG. 3A also shows wires 160(1) and 160(2) (hereinafter referred to as wires 160 or wire 160).

FIG. 3B shows the internal components of heat pump 152 in an exploded view. In this embodiment, bolts 162(1) through 162(4) (hereinafter referred to as bolts 162 or bolt 162) and washers 164(1) through 164(4) (hereinafter washers 164 or washer 164) are shown connecting the hot-side heat spreader 156, through the SAS structure 154, to a cold-side heat spreader 166 at the bottom of the heat pump 152. The hot-side heat spreader 156 fits into a first open side 168 of the SAS structure 154 such that a periphery of the hot-side heat spreader 156 mechanically contacts a top surface 170 (i.e., the top of the wall) of the SAS structure 154. The cold-side heat spreader 166 fits into a second open side 172 of the SAS structure 154 such that a periphery of the cold-side heat spreader 166 mechanically contacts a bottom surface 174 (i.e., the bottom of the wall) of the SAS structure 154. Heat pump 152 also contains an interconnect board 176 with TEMs 178(1) through 178(4) (hereinafter referred to as TEMs 178 or TEM 178). In this embodiment, the wires 160 are electrically connected to the interconnect board 176 in order to provide power to the TEMs 178. While only two wires 160 are shown for convenience, the present disclosure is not limited thereto. In this embodiment, no insulation is shown. A preformed insulation can be used, or an injected insulation, such as a foam insulation, may be used. In some embodiments, the injected insulation serves to reduce a thermal parasitic of heat pump 152 by insulating the hot-side heat spreader 156 from the cold-side heat spreader 166, and the injected insulation serves to create an environmental barrier where the hot-side heat spreader 156 and the cold-side heat spreader 166 mechanically contact the SAS structure 154.

FIG. 3C shows a side-profile cutaway view of the heat pump 152. In this view, the SAS structure 154 is shown as two pieces due to the cutaway. As before, the SAS structure 154 provides a defined distance 180 between the hot-side heat spreader 156 and the cold-side heat spreader 166. This defined distance 180 can be adjusted by adjusting the height of the SAS structure 154 and how the hot-side heat spreader 156 and the cold-side heat spreader 166 mechanically connect to the SAS structure 154.

FIGS. 4A-C illustrate a heat pump 182 according to another embodiment of the present disclosure. This thermoelectric heat pump 182 may, in some embodiments, may be utilized in the thermoelectric refrigeration system 100 as the thermoelectric heat pump 112. Heat pump 182 shares many features in common with heat pump 120 illustrated in FIGS. 2A-C and heat pump 152 illustrated in FIGS. 3A-C. As such, some repetition is avoided, while particular emphasis is placed on the features of heat pump 182 that are different from heat pump 120 and heat pump 152. In this regard, FIG. 4A illustrates heat pump 182 with a SAS structure 184. Heat pump 182 also includes a hot-side heat spreader 186. Unlike heat pump 120 and heat pump 152, FIG. 4A shows that heat pump 182 includes an electrical connector 188 exposed through the SAS structure 184 for connecting heat pump 182 to an external power source 190. Also, SAS structure 184 includes a snap fastener, or snap feature, that enables, in this embodiment, the hot-side heat spreader 186 to be snapped into the top opening of the SAS structure 184 and held in place by tension. Note that while the hot-side heat spreader 186 is attached by the snap feature, in this example, the cold-side heat 194 may additionally or alternatively be attached by a similar snap feature as the bottom opening of the SAS structure 184.

In this example, the snap feature includes at least one lip 192 around the periphery of the SAS structure 184 at the top opening that allows the hot-side heat spreader 186 to be snapped into the top opening of the SAS structure 184 and subsequently held in place by tension. According to some embodiments, the lip 192 is at least partially flexible. The flexibility of the lip 192 is such that when the hot-side heat spreader 186 is pressed into the opening of the SAS structure 184, the lip 192 will allow it to enter the opening of the SAS structure 184. The lip 192 then flexes back toward its original position where a portion of the lip 192 engages the periphery of the hot-side heat spreader 186 to thereby hold the hot-side heat spreader 186 in place by tension.

FIG. 4B shows the internal components of heat pump 182 in an exploded view. In this embodiment, a cold-side heat spreader 194 forms the bottom of the heat pump 182 by fitting into the bottom at the SAS structure 184. The hot-side heat spreader 186 fits into a first open side 196 of the SAS structure 184 such that a periphery of the hot-side heat spreader 186 mechanically contacts a top surface 198 (i.e., the top of the wall) of the SAS structure 184. The cold-side heat spreader 194 fits into a second open side 200 of the SAS structure 184 such that a periphery of the cold-side heat spreader 194 mechanically contacts a bottom surface 202 (i.e., the bottom of the wall) of the SAS structure 184. According to some embodiments, the second open side of the SAS structure 184 is smaller than the cold-side heat spreader 194 such that when the cold-side heat spreader 194 is inserted into the SAS structure 184, the cold-side heat spreader 194 will not fall through the opening. In one embodiment, this is further accomplished by the SAS structure 184 being tapered such that the second open side of the SAS structure 184 is smaller than the first open side of the SAS structure 184. According to some embodiments, this tapering allows for less strict size tolerances of the cold-side heat spreader 194, since if the cold-side heat spreader 194 is slightly larger than intended, the periphery of the cold-side heat spreader 194 will mechanically contact the SAS structure 184 slightly farther from the bottom of the SAS structure 184 than intended. Also, if the cold-side heat spreader 194 is slightly smaller than intended, the periphery of the cold-side heat spreader 194 will mechanically contact the SAS structure 184 slightly closer to the bottom of the SAS structure 184 than intended, assuming that the second open side of the SAS structure 184 is still smaller than the cold-side heat spreader 194.

Heat pump 182 also contains an interconnect board 204 with TEMs 206(1) through 206(4) (hereinafter referred to as TEMs 206 or TEM 206). In this embodiment, the electrical connector is electrically connected to the interconnect board 204 in order to provide power to the TEMs 206. While only one type of electrical connector is shown for convenience, the present disclosure is not limited thereto. In this embodiment, no insulation is shown. A preformed insulation can be used, or an injected insulation, such as a foam insulation, may be used. In some embodiments, the injected insulation serves to reduce a thermal parasitic of heat pump 182 by insulating the hot-side heat spreader 186 from the cold-side heat spreader 194, and the injected insulation serves to create an environmental barrier where the hot-side heat spreader 186 and the cold-side heat spreader 194 mechanically contact the SAS structure 184.

FIG. 4C shows a side-profile cutaway view of the heat pump 182. In this view, the SAS structure 184 is shown as two pieces due to the cutaway. As previously discussed, in this embodiment, the SAS structure 184 is tapered such that the second open side of the SAS structure 184 is smaller than the first open side of the SAS structure 184. Also, FIG. 4C shows two lips 192 that are able to hold the hot-side heat spreader 186 in place with tension.

Note that while the embodiments of FIGS. 2A-2C, 3A-3C, and 4A-4C show some different features, it should be noted that the features of the different embodiments can be combined any suitable manner. For example, the snap fastener of FIGS. 4A-4C may be utilized in the embodiments of FIGS. 2A-2C and 3A-3C. Similarly, the connector 190 of FIGS. 4A-4C may be utilized in the embodiments of FIGS. 2A-C and 3A-3C.

Those skilled in the art will recognize improvements and modifications to the preferred embodiments of the present disclosure. All such improvements and modifications are considered within the scope of the concepts disclosed herein and the claims that follow.

What is claimed is:

1. A heat pump, comprising:
 a surround and spacer (SAS) structure comprising a wall defining a first open side and a second open side;
 an interconnect board enclosed within the SAS structure, the interconnect board comprising one or more openings from a first surface of the interconnect board to a second surface of the interconnect board, the one or more openings defining locations at which a plurality of thermoelectric modules are to be mounted on the interconnect board;
 the plurality of thermoelectric modules mounted on the interconnect board at the locations defined by the one or more openings, each thermoelectric module of the plurality of thermoelectric modules having a first side and a second side;
 a hot-side heat spreader that is in thermal contact with the first side of each thermoelectric module of the plurality of thermoelectric modules; and
 a cold-side heat spreader that is in thermal contact with the second side of each thermoelectric module of the plurality of thermoelectric modules;
 wherein a periphery of the hot-side heat spreader mechanically contacts the wall of the SAS structure at the first open side, and a periphery of the cold-side heat spreader mechanically contacts the wall of the SAS structure at the second open side such that a compression force applied to the heat pump is absorbed by the SAS structure.

2. The heat pump of claim 1 further comprising an environmental seal located where the periphery of the hot-side heat spreader mechanically contacts the wall of the SAS structure and where the periphery of the cold-side heat spreader mechanically contacts the wall of the SAS structure.

3. The heat pump of claim 1 wherein a thickness of the wall of the SAS structure is such that a thermal short between the hot-side heat spreader and the cold-side heat spreader is mitigated while providing sufficient strength to withstand at least a predefined amount of a compression force applied to the heat pump.

4. The heat pump of claim 1 wherein a height of the SAS structure defines a distance between the hot-side heat spreader and the cold-side heat spreader where the distance is such that a thermal short between the hot-side heat spreader and the cold-side heat spreader is mitigated while mitigating a thermal resistance of one or both of the hot-side heat spreader and the cold-side heat.

5. The heat pump of claim 1 wherein a combined area of the second sides of the plurality of thermoelectric modules is greater than fifty percent of the area of the interconnect board.

6. The heat pump of claim 5 wherein the combined area of the second sides of the plurality of thermoelectric modules is greater than seventy-five percent of the area of the interconnect board.

7. The heat pump of claim 1 further comprising insulation between the hot-side heat spreader and the cold-side heat spreader and enclosed in the SAS structure.

8. The heat pump of claim 7 wherein the insulation is preformed.

9. The heat pump of claim 7 wherein the insulation is injected.

10. The heat pump of claim 1 wherein the hot-side heat spreader and the cold-side heat spreader are attached to the SAS structure by a mechanical fastener.

11. The heat pump of claim 10 wherein the mechanical fastener is selected from the group consisting of a screw, a bolt, and a rivet.

12. The heat pump of claim 1 wherein the hot-side heat spreader and the cold-side heat spreader are attached to the SAS structure by a chemical fastener.

13. The heat pump of claim 12 wherein the chemical fastener is selected from the group consisting of a glue, an epoxy, and an acrylic adhesive.

14. The heat pump of claim 1 wherein at least one of the hot-side heat spreader and the cold-side heat spreader is attached to the SAS structure by a snap fastener.

15. The heat pump of claim 14 wherein the snap fastener includes a lip around a periphery of the SAS structure that allows the at least one of the hot-side heat spreader and the cold side heat spreader to be attached to the SAS structure by tension.

16. The heat pump of claim 1 wherein the second open side of the SAS structure is smaller than the cold-side heat spreader, and the cold-side heat spreader is within the SAS structure at the second open side of the SAS structure.

17. The heat pump of claim 16 wherein the SAS structure is tapered such that the second open side of the SAS structure is smaller than the first open side of the SAS structure.

18. The heat pump of claim 1 further comprising one or more wires electrically attached to the interconnect board and exposed through the SAS structure.

19. The heat pump of claim 18 further comprising a cap to protect the one or more wires exposed through the SAS structure.

20. The heat pump of claim 1 wherein the interconnect board further comprises one or more electrical connectors exposed through the SAS structure.

* * * * *